(12) United States Patent
Kang et al.

(10) Patent No.: US 11,882,720 B2
(45) Date of Patent: Jan. 23, 2024

(54) ORGANIC LIGHT-EMITTING PANEL AND ORGANIC LIGHT-EMITTING DISPLAY DEVICE INCLUDING SAME

(71) Applicant: LG Display Co., Ltd., Seoul (KR)

(72) Inventors: Seung-Hee Kang, Paju-si (KR); Seyong Lee, Paju-si (KR); Hyun Kyung Lee, Paju-si (KR); SeokYoung Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 98 days.

(21) Appl. No.: 17/112,696

(22) Filed: Dec. 4, 2020

(65) Prior Publication Data

US 2021/0202895 A1  Jul. 1, 2021

(30) Foreign Application Priority Data

Dec. 31, 2019 (KR) .......................... 10-2019-0179716

(51) Int. Cl.
*H10K 50/842* (2023.01)
*H10K 50/844* (2023.01)
*H10K 59/122* (2023.01)
*H10K 59/124* (2023.01)

(52) U.S. Cl.
CPC ....... *H10K 50/8426* (2023.02); *H10K 50/844* (2023.02); *H10K 59/122* (2023.02); *H10K 59/124* (2023.02)

(58) Field of Classification Search
CPC ............. H01L 27/3246; H01L 27/3258; H01L 27/3276; H01L 51/5246; H01L 51/5253; H10K 59/124; H10K 59/122; H10K 50/8426; H10K 50/844
See application file for complete search history.

(56) References Cited

U.S. PATENT DOCUMENTS

| 2016/0365398 A1* | 12/2016 | Kim | H10K 50/8426 |
| 2017/0365814 A1* | 12/2017 | Kim | H10K 50/8445 |
| 2019/0296099 A1* | 9/2019 | Lee | H10K 59/1315 |
| 2020/0312933 A1* | 10/2020 | Lee | H10K 59/00 |

* cited by examiner

*Primary Examiner* — Vongsavanh Sengdara
(74) *Attorney, Agent, or Firm* — Seed IP Law Group LLP

(57) ABSTRACT

Provided are an organic light-emitting panel and an organic light-emitting display device including the same. In the organic light-emitting panel, a planarization layer has at least one contact holes in an active area, and first inclination of a first side surface of the planarization layer, located in the non-active area and closest to a dam, with respect to the top surface of the substrate is smaller than a second inclination of a second side surface of the planarization layer, surrounding the contact hole, with respect to the top surface of the substrate. Due to the gentle inclination of the first side surface of the planarization layer, each of the connector electrode, the bank, and the first encapsulation layer disposed on the first side surface of the planarization layer may also have a gentle inclination, such that the second encapsulation layer material having high flowability may flow along the top surface of the first encapsulation layer to cover the surfaces of the planarization layer and the bank in the non-active area. Accordingly, the encapsulation ability of the encapsulation member in a non-active area is improved.

26 Claims, 9 Drawing Sheets

ORGANIC LIGHT-EMITTING PANEL AND ORGANIC LIGHT-EMITTING DISPLAY DEVICE INCLUDING SAME

CROSS REFERENCE TO RELATED APPLICATION

This application claims priority from Korean Patent Application No. 10-2019-0179716, filed on Dec. 31, 2019, which is hereby incorporated by reference for all purposes as if fully set forth herein.

BACKGROUND

Technical Field

Embodiments relate to an organic light-emitting panel and an organic light-emitting display device including the same and, more particularly, to an organic light-emitting panel and an organic light-emitting display device having a reliable encapsulation layer structure.

Description of Related Art

Organic light-emitting display devices are self-emissive display devices. Differently from liquid crystal display (LCD) devices, organic light-emitting display devices may be fabricated with a thin and light profile, since a separate light source is not required. In addition, organic light-emitting display devices are not only advantageous in terms of power consumption due to low-voltage driving, but also have superior properties, such as high color reproducibility, rapid response rates, wide viewing angles, and high contrast ratios (CRs). Accordingly, organic light-emitting display devices have been researched as next-generation display devices.

Organic light-emitting display devices are vulnerable to oxygen, moisture, or the like, since an organic material is used for a light-emitting layer. Accordingly, a variety of technological approaches for sealing organic light-emitting elements, such as organic light-emitting diodes (OLEDs), are being used in order to reduce or minimize the penetration of oxygen, moisture, or the like from the external environment into an organic layer including the light-emitting layer.

BRIEF SUMMARY

Thin film encapsulation technology of stacking inorganic layers and organic layers in an alternating manner has been used to seal an organic light-emitting element, such as an organic light-emitting diode (OLED). For example, a three-layer encapsulation layer structure may be used. Here, the encapsulation layer structure may include a first encapsulation layer, a second encapsulation layer disposed on the first encapsulation layer, and a third encapsulation layer disposed on the second encapsulation layer.

In a case in which the first encapsulation layer has a defective area caused by foreign matter or particles, the first encapsulation layer may be protected by the second encapsulation layer covering the first encapsulation layer.

However, the second encapsulation layer may be outside of an actual design, due to high flowability of a second encapsulation layer material containing an organic material. In a case in which the second encapsulation layer material is applied in a smaller amount in consideration of the flowability thereof, the second encapsulation layer may only be provided on a portion of the top surface of a bank in a non-active area of the organic light-emitting panel.

In this case, the second encapsulation layer material may fail to properly cover the first encapsulation layer. In a case in which a defective area is present in the first encapsulation layer, moisture or oxygen may penetrate into the defective area of the first encapsulation layer. Having recognized these problems as well as other technical problems in the related art, the inventors of the present disclosure have provided a novel structure and method of manufacturing an organic light-emitting panel and an organic light-emitting display device, in which an encapsulation layer structure including an organic layer may be disposed to cover the surfaces of the bank and a planarization layer in a non-active area, even in consideration of flowability of the second encapsulation layer material.

One or more embodiments of the present disclosure provides an organic light-emitting panel and an organic light-emitting display device having a structure by which the inclination of a first side surface of the planarization layer disposed closest to a dam in the non-active area may be adjusted to control the flowability of the second encapsulation layer material on the first side surface of the planarization layer, so that the second encapsulation layer may be provided in the non-active area to cover the bank and the planarization layer, even in the case in which the second encapsulation layer material is applied to the surface of a substrate in a smaller amount.

The technical benefits of the present disclosure is not limited to the aforementioned description, and other benefits not explicitly disclosed herein will be clearly understood by those having ordinary knowledge in the technical field, to which the present disclosure pertains, from the description provided hereinafter.

A planarization layer and bank structure according to an embodiment of the present disclosure provides an organic light-emitting panel having a structure in which a second encapsulation layer may cover the surface of the planarization layer and the bank in a non-active area. The organic light-emitting panel having an active area and a non-active area located at periphery of the active area includes a planarization layer disposed on a substrate, with at least one contact hole being provided in the planarization layer in the active area. The organic light-emitting panel further includes an organic light-emitting diode including a first electrode disposed on the planarization layer, a bank disposed on a portion of a top surface of the planarization layer and a portion of a top surface of the first electrode, an organic layer disposed on the top surface of the first electrode disposed in a first open area of the bank in the active area, and a second electrode disposed on the organic layer and the bank. The organic light-emitting panel further includes at least one dam located in the non-active area to surround the active area and an encapsulation member disposed on the second electrode and the substrate on which the dam is disposed. From among side surfaces of the planarization layer, a first inclination of a first side surface of the planarization layer, located in the non-active area and closest to the dam, with respect to a top surface of the substrate is smaller than a second inclination of a second side surface of the planarization layer, surrounding the contact hole, with respect to the top surface of the substrate.

A planarization layer and bank structure according to an embodiment of the present disclosure provides an organic light-emitting display device having a structure in which a second encapsulation layer may cover the surface of the planarization layer and the bank in a non-active area. The organic light-emitting display device includes an organic light-emitting panel having an active area and a non-active area located at periphery of the active area includes a planarization layer disposed on a substrate, with at least one contact hole being provided in the planarization layer in the active area, and a driver circuit driving the display panel. The organic light-emitting panel further includes an organic light-emitting diode including a first electrode disposed on the planarization layer, a bank disposed on a portion of a top surface of the planarization layer and a portion of a top surface of the first electrode, an organic layer disposed on the top surface of the first electrode disposed in a first open area of the bank in the active area, and a second electrode disposed on the organic layer and the bank. The organic light-emitting panel further includes at least one dam located in the non-active area to surround the active area and an encapsulation member disposed on the second electrode and the substrate on which the dam is disposed. From among side surfaces of the planarization layer, a first inclination of a first side surface of the planarization layer, located in the non-active area and closest to the dam, with respect to a top surface of the substrate is smaller than a second inclination of a second side surface of the planarization layer, surrounding the contact hole, with respect to the top surface of the substrate.

According to embodiments of the present disclosure, the first inclination of the first side surface of the planarization layer, located in the non-active area and closest to the dam, with respect to the top surface of the substrate is smaller than the second inclination of the second side surface of the planarization layer, surrounding the contact hole, with respect to the top surface of the substrate. Accordingly, the second encapsulation layer may be disposed to cover the surfaces of the planarization layer and the bank in the non-active area, thereby improving the encapsulation ability of the encapsulation member.

BRIEF DESCRIPTION OF THE SEVERAL VIEWS OF THE DRAWINGS

The above and other objects, features, and advantages of the present disclosure will be more clearly understood from the following detailed description, taken in conjunction with the accompanying drawings, in which.

DETAILED DESCRIPTION

Figure 1:
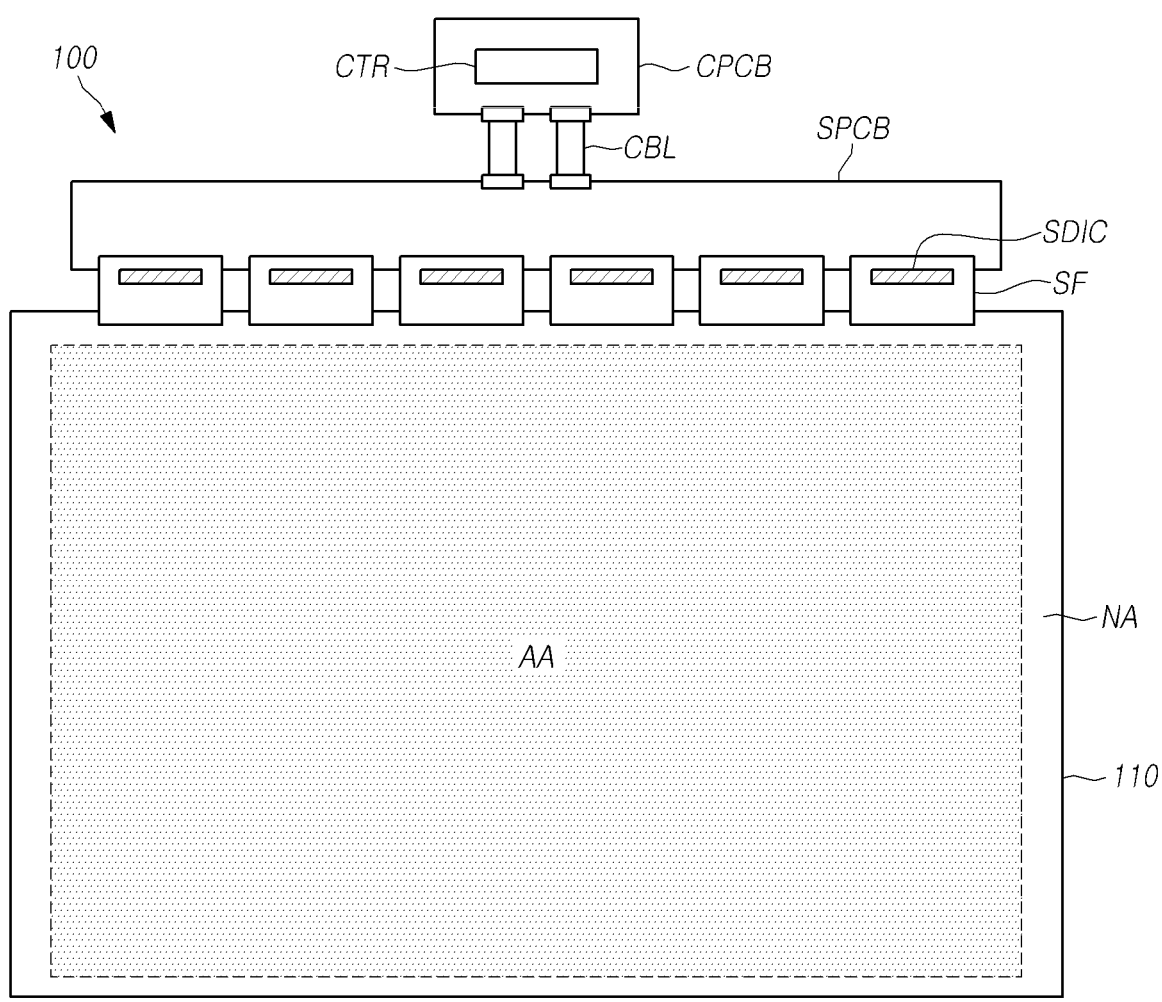
FIG. 1 is a schematic view illustrating an example system of an organic light-emitting display device according to embodiments.

The advantages and features of the present disclosure and methods of the realization thereof will be apparent with reference to the accompanying drawings and detailed descriptions of the embodiments. The present disclosure should not be construed as being limited to the embodiments set forth herein and may be embodied in a variety of different forms. Rather, these embodiments are provided so that the present disclosure will be thorough and complete, and will fully convey the scope of the present disclosure to those having ordinary knowledge in the technical field.

The shapes, sizes, ratios, angles, numbers, and the like, inscribed in the drawings to illustrate embodiments are illustrative only, and the present disclosure is not limited to the embodiments illustrated in the drawings. Throughout this document, the same reference numerals and symbols will be used to designate the same or like components. In the following description of the present disclosure, detailed descriptions of known functions and components incorporated into the present disclosure will be omitted in the situation in which the subject matter of the present disclosure may be rendered unclear thereby. It will be understood that the terms "comprise," "include," "have," and any variations thereof used herein are intended to cover non-exclusive inclusions unless explicitly described to the contrary. Descriptions of components in the singular form used herein are intended to include descriptions of components in the plural form, unless explicitly described to the contrary.

In the analysis of a component, it shall be understood that an error range is included therein, even in the situation in which there is no explicit description thereof.

When spatially relative terms, such as "on," "above," "under," "below," and "on a side of," are used herein for descriptions of relationships between one element or component and another element or component, one or more intervening elements or components may be present between the one and other elements or components, unless a term, such as "immediately" or "directly," is used.

In addition, terms, such as "first" and "second" may be used herein to describe a variety of components. It should be understood, however, that these components are not limited by these terms. These terms are merely used to discriminate one element or component from other elements or components. Thus, a first component referred to as first hereinafter may be a second component within the spirit of the present disclosure.

The features of embodiments of the present disclosure may be partially or entirely coupled or combined with each other and may work in concert with each other or may operate in a variety of technical methods. In addition, respective embodiments may be carried out independently or may be associated with and carried out in concert with other embodiments.

Hereinafter, a variety of configurations of an organic light-emitting panel and an organic light-emitting display device according to embodiments, each including a planarization layer and bank structure, will be described in detail.

According to configurations of the organic light-emitting panel and the organic light-emitting display device of the present disclosure, provided is an organic light-emitting panel having an active area and a non-active area located at periphery of the active area. The organic light-emitting panel may include: a substrate; a planarization layer disposed on the substrate, with at least one contact hole being provided in the planarization layer in the active area; a first electrode disposed on the planarization layer; a bank disposed on a portion of a top surface of the planarization layer and a portion of a top surface of the first electrode; an organic layer disposed on the top surface of the first electrode disposed in a first open area of the bank in the active area; a second electrode disposed on the organic layer and the bank; at least one dam located in the non-active area to surround the active area; and an encapsulation member disposed on the second electrode and the substrate on which the dam is disposed. From among side surfaces of the planarization layer, a first inclination of a first side surface of the planarization layer, located in the non-active area and closest to the dam, with respect to a top surface of the substrate is smaller than a second inclination of a second side surface of the planarization layer, surrounding the contact hole, with respect to the top surface of the substrate.

According to configurations of the organic light-emitting panel and the organic light-emitting display device of the present disclosure, in the non-active area, a first side surface of the bank located in the non-active area and closest to the dam may overlap the first side surface of the planarization layer, and one edge of the bank may overlap one edge of the planarization layer.

In the non-active area, a third inclination of the first side surface of the bank with respect to the top surface of the substrate may be equal to or greater than the first inclination of the planarization layer. The third inclination may be smaller than a fourth inclination of a second side surface of the bank, surrounding the first open area of the bank, with respect to the top surface of the substrate. A first encapsulation layer of the encapsulation member may be disposed on the first side surface of the bank, and in an area corresponding to an area in which the first side surface of the bank is disposed, the first encapsulation layer has an inclination corresponding to the third inclination. In the non-active area, an outermost portion of the top surface of the planarization layer and an outermost portion of the top surface of the bank may be disposed to be equally spaced apart from the dam, and an end portion of the first side surface of the planarization layer and an end portion of the first side surface of the bank may be disposed to be equally spaced apart from the dam. Alternatively, in the non-active area, an outermost portion of the top surface of the planarization layer may be further spaced apart from the dam than an outermost portion of the top surface of the bank, and an end portion of the first side surface of the planarization layer and an end portion of the first side surface of the bank may be equally spaced apart from the dam.

According to configurations of the organic light-emitting panel and the organic light-emitting display device of the present disclosure, in the non-active area, the bank may be disposed to cover the first side surface of the planarization layer.

In the non-active area, a third inclination of the first side surface of the bank with respect to the top surface of the substrate may be smaller than the first inclination of the planarization layer. The third inclination may be smaller than a fourth inclination of a second side surface of the bank, surrounding the first open area of the bank, with respect to the top surface of the substrate. A first encapsulation layer of the encapsulation member may be disposed on the first side surface of the bank, and in an area corresponding to an area in which the first side surface of the bank is disposed, the first encapsulation layer may have an inclination corresponding to the third inclination. In the non-active area, an outermost portion of the top surface of the planarization layer may be disposed closer to the dam than an outermost portion of the top surface of the bank, and an end portion of the first side surface of the planarization layer may be further spaced apart from the dam than an end portion of the first side surface of the bank.

According to configurations of the organic light-emitting panel and the organic light-emitting display device of the present disclosure, in the non-active area, the bank may be disposed to overlap the top surface of the planarization layer and expose the first side surface of the planarization layer.

Here, a third inclination of the first side surface of the bank, located in the non-active area and closest to the dam, with respect to the top surface of the substrate may be smaller than the first inclination of the planarization layer. The third inclination may be smaller than a fourth inclination of a second side surface of the bank, surrounding the first open area of the bank, with respect to the top surface of the substrate. An outermost portion of the top surface of the planarization layer may be located closer to the dam than an end portion of the first side surface of the bank. A first encapsulation layer of the encapsulation member may be disposed on the first side surface of the bank and the first side surface of the planarization layer, and the inclination of the first encapsulation layer with respect to the top surface of the substrate may change at a boundary between the first side surface of the bank and the first side surface of the planarization layer.

According to configurations of the organic light-emitting panel and the organic light-emitting display device of the present disclosure, an angle ranging from 15° to 30° may be defined between the first side surface of the planarization layer and the top surface of the substrate.

According to configurations of the organic light-emitting panel and the organic light-emitting display device of the present disclosure, in the non-active area, a second encapsulation layer may be disposed to cover the first side surface of the planarization layer and the bank.

According to configurations of the organic light-emitting panel and the organic light-emitting display device of the present disclosure, one edge of a second encapsulation layer of the encapsulation member may be disposed closer to the dam than the planarization layer and the bank.

According to configurations of the organic light-emitting panel and the organic light-emitting display device of the present disclosure, the bank may have at least one second open area exposing a connector electrode disposed on the planarization layer in the non-active area, and a third inclination of the first side surface of the bank, disposed closest to the dam, with respect to the top surface of the substrate may be smaller than a fifth inclination of a third side surface of the bank, surrounding the second open area, with respect to the top surface of the substrate.

Hereinafter, embodiments of the present disclosure will be described in detail with reference to the accompanying drawings.

FIG. 1 is a schematic view illustrating an example system of an organic light-emitting display device according to embodiments.

Referring to FIG. 1, in an organic light-emitting display device 100 according to embodiments, a data driver (DDR) may be implemented using a chip-on-film (COF) structure among a plurality of structures, such as a tape-automated bonding (TAB) structure, a chip-on-glass (COG) structure, and the COF structure, while a gate driver (GDR) may be implemented using a gate-in-panel (GIP) structure among a variety of structures, such as a TAB structure, a COG structure, a COF structure, and the GIP structure.

The data driver (DDR) may be comprised of one or more source driver integrated circuits (ICs) SDIC. A case in which the data driver (DDR) is comprised of a plurality source driver ICs SDIC is illustrated in FIG. 1.

In a case in which the data driver (DDR) has the COF structure, the source driver ICs SDIC of the data driver (DDR) may be mounted on source-side circuit films SF, respectively.

One side of each of the source-side circuit films SF may be electrically connected to a pad assembly (e.g., an assembly of pads) present in a non-active area NA of the display panel 110.

Conductive lines may be disposed on the source-side circuit films SF to electrically connect the source driver ICs SDIC and the display panel 110.

Electronic devices of the organic light-emitting display device 100 may include at least one source PCB (PCB) SPCB and a control PCB CPCB, on which control components and a variety of electric devices are mounted, so that the plurality of source driver ICs SDIC and other devices are in circuit connection.

The other side of each of the source-side circuit films SF, on which the source driver ICs SDIC are mounted, may be connected to the at least one source PCB SPCB.

That is, one side of each of the source-side circuit films SF, on which the source driver ICs SDIC are mounted, may be electrically connected to the non-active area NA of the display panel 110, while the other side of each of the source-side circuit films SF may be electrically connected to the source PCB SPCB.

A controller CTR, controlling the operations of the data driver (DDR), the gate driver (GDR), and the like, may be disposed on the control PCB CPCB.

In addition, a power management IC (PMIC) and the like may be disposed on the control PCB CPCB to supply various forms of voltage or current to the display panel 110, the data driver (DDR), the gate driver (GDR), and the like or to control various forms of voltage or current to be supplied to the same.

The source PCB SPCB and the control PCB CPCB may be in circuit connection via at least one connector CBL. The connector CBL may be, for example, a flexible printed circuit (FPC), a flexible flat cable (FFC), or the like.

The at least one source PCB SPCB and the control PCB CPCB may be combined to a single PCB.

In a case in which the gate driver (GDR) is implemented using a GIP structure, a plurality of gate driver circuits (GDCs) of the gate driver (GDR) may be directly provided on the non-active area NA of the display panel 110.

Each of the plurality of gate driver circuits may output a scan signal (SCAN) to a corresponding gate line (GL) located in the active area AA of the display panel 110, among the plurality of gate lines (GL).

The plurality of gate driver circuits disposed on the display panel 110 may be supplied with a variety of signals (e.g., a clock signal, a high-level gate voltage (VGH), a low-level gate voltage (VGL), a start signal (VST), and a reset signal (RST)) necessary for the generation of the scan signal, through gate driving-related conductive lines located in the non-active area NA.

The gate driving-related conductive lines located in the non-active area NA may be electrically connected to some of the source-side circuit films SF disposed closest to the plurality of gate driver circuits (GDCs).

Figure 2:
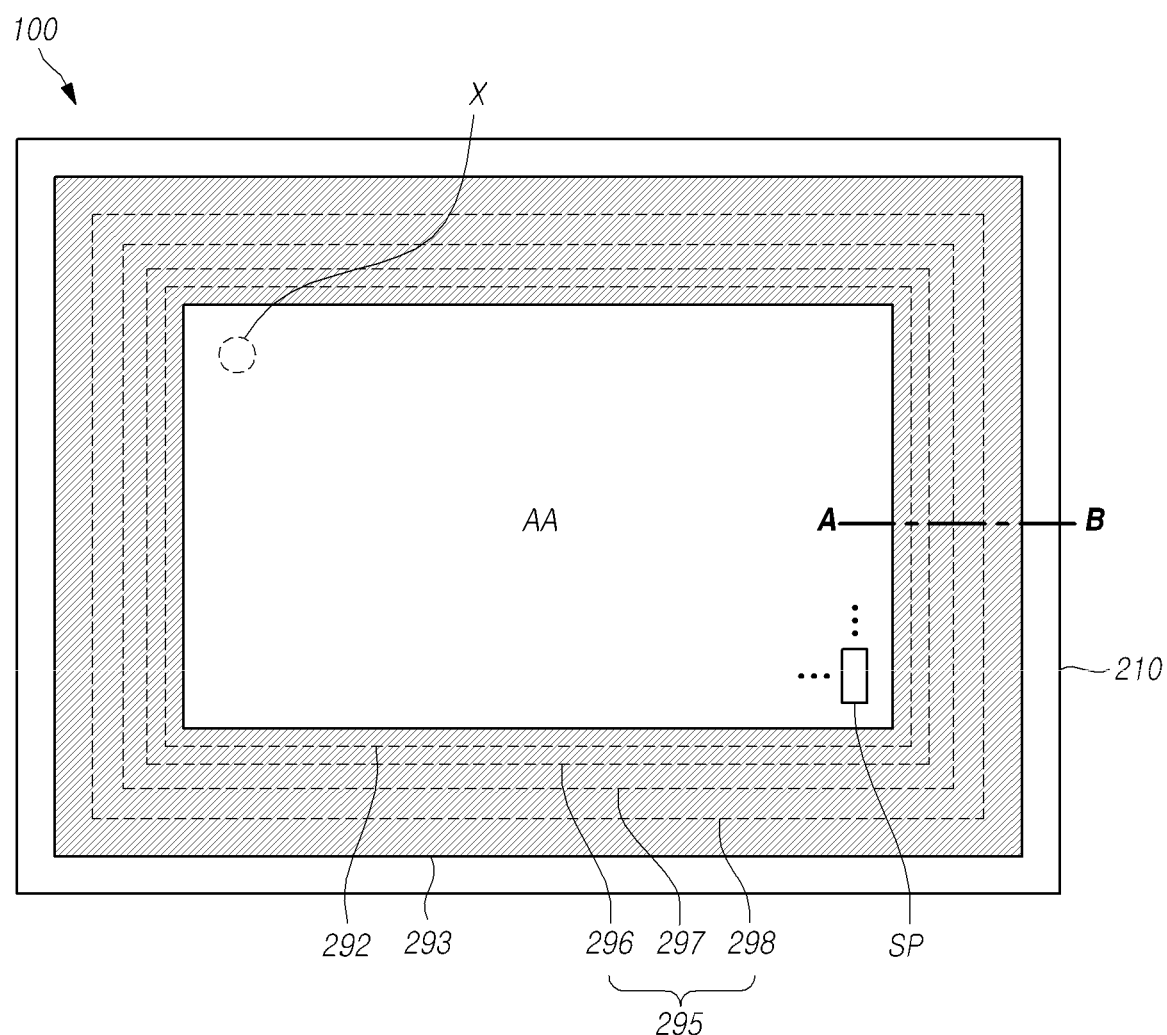
FIG. 2 is a plan view schematically illustrating a display panel structure of an organic light-emitting display device according to embodiments.

FIG. 2 is a plan view schematically illustrating a display panel structure of an organic light-emitting display device according to embodiments.

Referring to FIG. 2, the display panel 110 of the organic light-emitting display device according to embodiments may include the active area AA in which a plurality of subpixels SP are disposed and the non-active area NA provided at the periphery of the active area AA.

Although not shown in the drawings, a single subpixel SP may include at least one emission area and a non-emission area surrounding the emission area.

At least one dam 295 may be disposed in the non-active area NA of the display panel 110 to surround the outer circumference of the active area AA.

For example, the dam 295 may include a first sub-dam 296 (hereinafter the first sub-dam 296 may be also referred to as the first dam 296) surrounding the active area AA while being spaced apart from the active area AA, a second sub-dam 297 (hereinafter the second sub-dam 297 may be also referred to as the second dam 297) surrounding the first sub-dam 296 while being spaced apart from the first sub-dam 296, and a third sub-dam 298 (hereinafter the third sub-dam 298 may be also referred to as the third dam 298) surrounding the second sub-dam 297 while being spaced apart from the second dam 297. In this embodiment, the first sub-dam 296 is the closest to the active area AA.

Although the structure of the dam 295 including three sub-dams is illustrated in FIG. 2, embodiments of the present disclosure are not limited thereto. The display panel 110 according to embodiments may include one dam alone. It can also include two or more dams that are separate and distinct dams. In addition, one or more of the dams can have sub-dams within them. According to one embodiment, there is one dam 295. According to another embodiment, this one dam 295 has three sub-dams, 296, 297 and 298.

In the active area AA of the display panel 110, an encapsulation member including a first encapsulation layer 391 (see FIG. 3), a second encapsulation layer 292, and a third encapsulation layer 293 may be disposed on the substrate 210. The encapsulation member may be disposed to extend to at least a portion of the non-active area NA.

That is, the encapsulation member including the first encapsulation layer 391, the second encapsulation layer 292, and the third encapsulation layer 293 may be disposed to cover the active area AA of the display panel 110.

The first encapsulation layer 391 among the components of the encapsulation member may overlap the third encapsulation layer 293. The first encapsulation layer 391 and the third encapsulation layer 293 may overlap the first to third sub-dams 296 to 298. Here, at least one edge of the first encapsulation layer 391 may overlap one edge of the third encapsulation layer 293.

In addition, the second encapsulation layer 292 may overlap the first encapsulation layer 391 and the third encapsulation layer 293. In the plan view, the area of the second encapsulation layer 292 may be smaller than the respective area of the first encapsulation layer 391 and the third encapsulation layer 293.

In addition, the second encapsulation layer 292 may be spaced apart from at least two dams among the first to third sub-dams 296 to 298. For example, as illustrated in FIG. 2, the second encapsulation layer 292 may be spaced apart from the first to third sub-dams 296 to 298.

In this case, one edge of the second encapsulation layer 292 may be disposed closer to the active area AA of the display panel 110 than one edge of each of the first to third sub-dams 296 to 298, the first encapsulation layer 391, and the third encapsulation layer 293.

However, the structure of the second encapsulation layer 292 according to embodiments is not limited thereto, and the second encapsulation layer 292 may be in contact with a portion of the first sub-dam 296 while being spaced apart from the second and third sub-dams 297 and 298.

The structure of the panel will be discussed in detail as follows.

Figure 3:
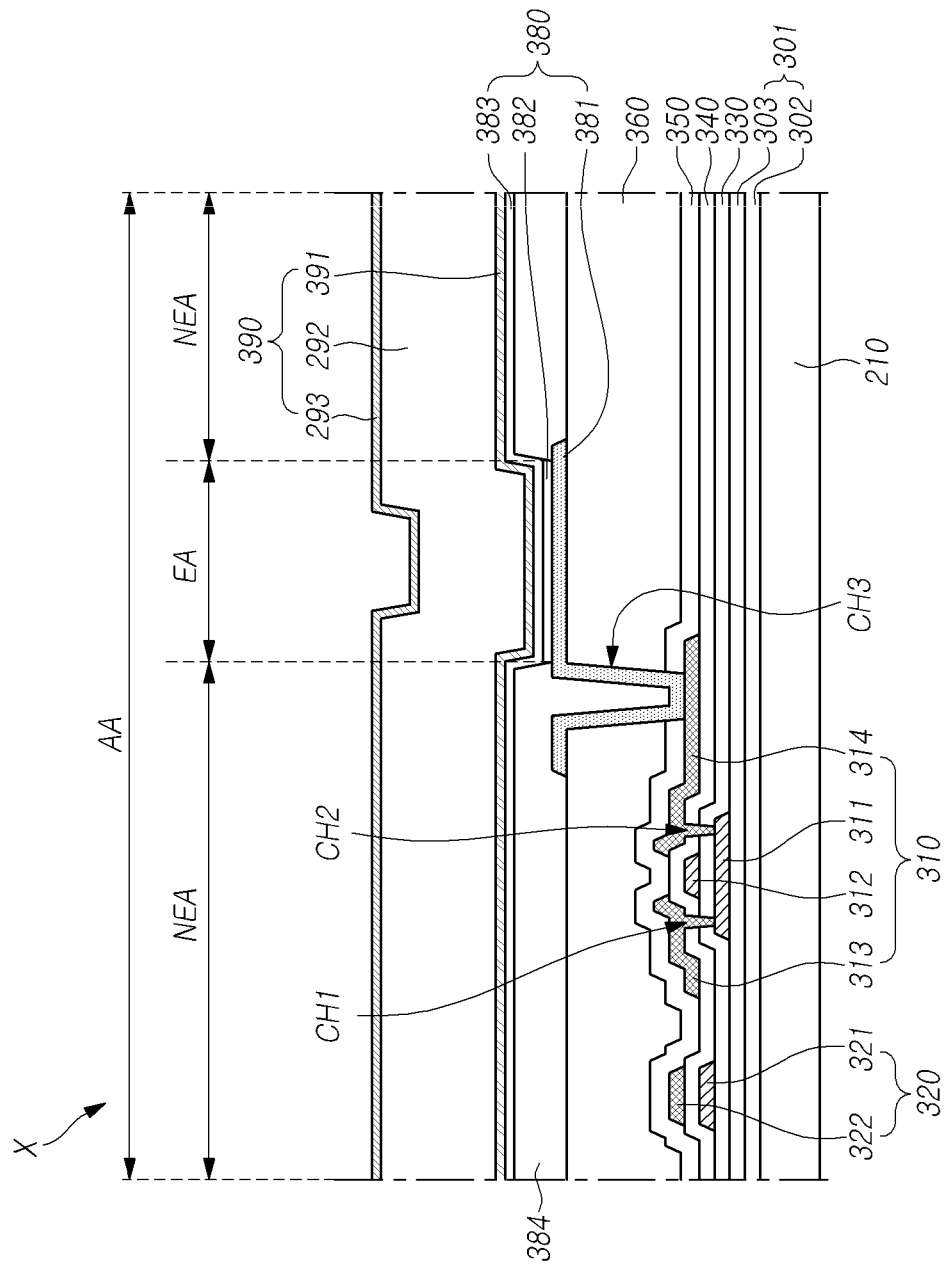
FIG. 3 is a cross-sectional view of area X (e.g., a portion of the active area) in FIG. 2.

FIG. 3 is a cross-sectional view of area X (e.g., a portion of the active area) in FIG. 2.

Referring to FIG. 3, the active area AA of the display panel 110 of the organic light-emitting display device according to embodiments may include a plurality of emission areas EA and a non-emission areas NEA surrounding the emission areas EA.

In the active area AA of the display panel 110, at least one transistor 310, at least one storage capacitor 320, and at least one organic light-emitting element or organic light-emitting diode (OLED) 380 may be disposed on the substrate 210.

The transistor 310 may include an active layer 311, a gate electrode 312, a source electrode 313, and a drain electrode 314.

The storage capacitor 320 may include a first storage capacitor electrode 321 and a second storage capacitor electrode 322.

The organic light-emitting diode 380 may include a first electrode 381, an organic layer 382, and a second electrode 383.

Specifically, a buffer layer 301 may be disposed on the substrate 210. The buffer layer 301 may include a first buffer layer 302 disposed on the substrate 210 and a second buffer layer 303 disposed on the first buffer layer 302.

The first and second buffer layers 302 and 303 may include different materials. For example, each of the first and second buffer layers 302 and 303 may have a structure in which at least two inorganic insulating material layers made of silicon oxide (SiOx), silicon nitride (SiNx), or silicon oxynitride (SiON) alternate with each other. However, the buffer layer 301 according to embodiments is not limited thereto.

In some cases, the buffer layer 301 may be omitted. The buffer layer 301 may have a single-layer structure or may have a multilayer structure comprised of three or more layers.

An active layer 311 may be disposed on the substrate 210. The active layer 311 may contain a silicon-based semiconductor material or an oxide-based semiconductor material, but the present disclosure is not limited thereto.

Although not shown in the drawings, a light-blocking layer shielding the active layer 311 from external light may further be disposed below the active layer 311.

The gate insulating film 330 may be disposed on the active layer 311.

The gate insulating film 330 may contain an inorganic insulating material. For example, the gate insulating film 330 may be made of an inorganic material, such as SiOx, SiNx, or SiON, but embodiments of the present disclosure are not limited thereto.

The gate electrode 312 may be disposed on the gate insulating film 330.

The gate electrode 312 may contain aluminum (Al), silver (Ag), gold (Au), copper (Cu), tungsten (W), molybdenum (Mo), chromium (Cr), nickel (Ni), neodymium (Nd), tantalum (Ta), titanium (Ti), and the like. However, embodiments of the present disclosure are not limited thereto, and any configuration may be used as long as the gate electrode 312 contains a conductive material.

Although the gate electrode 312 is illustrated as having a single-layer structure in FIG. 3, the present disclosure is not limited thereto. For example, the gate electrode 312 may have a multilayer structure comprised of two or more layers.

A first storage capacitor electrode 321 of the storage capacitor 320 may be disposed on the same layer as the gate electrode 312. That is, the first storage capacitor electrode 321 may be disposed on the gate insulating film 330.

The first storage capacitor electrode 321 may contain the same material as the gate electrode 312, but embodiments of the present disclosure are not limited thereto.

An interlayer insulating film 340 may be disposed on the gate electrode 312. The interlayer insulating film 340 may be made of an inorganic material, such as SiOx, SiNx, or SiON, but embodiments of the present disclosure are not limited thereto.

A source electrode 313 and a drain electrode 314 may be disposed on the interlayer insulating film 340. The source electrode 313 and the drain electrode 314 may be electrically connected to the active layer 311 through first and second contact holes CH1 and CH2 of the gate insulating film 330 and the interlayer insulating film 340.

Each of the source electrode 313 and the drain electrode 314 may contain Al, Ag, Au, Cu, W, Mo, Cr, Ni, Nd, Ta, Ti, and the like. However, embodiments of the present disclosure are not limited thereto, and any configuration may be used as long as the source electrode 313 and the drain electrode 314 contain a conductive material.

Although each of the source electrode 313 and the drain electrode 314 is illustrated as having a single-layer structure in FIG. 3, embodiments of the present disclosure are not limited thereto. For example, each of the source electrode 313 and the drain electrode 314 may have a multilayer structure comprised of two or more layers.

In addition, although the reference numeral 313 is the source electrode and the reference numeral 314 is the drain electrode in the structure illustrated in FIG. 3, embodiments of the present disclosure are not limited thereto. The reference numeral 313 may refer to the drain electrode, while the reference numeral 314 may refer to the source electrode.

The second storage capacitor electrode 322 of the storage capacitor 320 may be disposed on the same layer as the source electrode 313 and the drain electrode 314. That is, the second storage capacitor electrode 322 may be disposed on the interlayer insulating film 340.

Although the second storage capacitor electrode 322 may contain the same material as the source electrode 313 and the drain electrode 314, embodiments of the present disclosure are not limited thereto.

A passivation layer 350 may be disposed on the source electrode 313, the drain electrode 314, and the second storage capacitor electrode 322. Although the passivation layer 350 may contain an inorganic material, such as SiOx, SiNx, or SiON, embodiments of the present disclosure are not limited thereto.

A planarization layer 360 may be disposed on the passivation layer 350. The planarization layer 360 may contain an organic insulating material. For example, the planarization layer 360 may contain acryl resin, epoxy resin, phenolic resin, polyamide resin, polyimide resin, or the like, but embodiments of the present disclosure are not limited thereto.

The organic light-emitting diode 380 and a bank 384 may be disposed on the planarization layer 360.

The organic light-emitting diode 380 may include the first electrode 381, the organic layer 382, and the second electrode 383. Here, the first electrode 381 may be an anode, while the second electrode 383 may be a cathode. The organic layer 382 may include at least one emissive layer.

The first electrode 381 of the organic light-emitting diode 380 may be disposed on the planarization layer 360. The first electrode 381 may be electrically connected to the drain electrode 314 via third contact holes CH3 provided in the planarization layer 360 and the passivation layer 350.

Although not shown in FIG. 3, in the active area AA, a plurality of first electrodes 381 may be disposed on the planarization layer 360 and may be spaced apart from each other.

The first electrode 381 may contain a transparent conductive material.

The first electrode 381 may contain a transparent conductive material comprised of a metal oxide of a metal, such as zinc (Zn), indium (In), gallium (Ga), tin (Sn), or titanium (Ti), or a combination of a metal, such as zinc (Zn), indium (In), gallium (Ga), tin (Sn), or titanium (Ti), and an oxide thereof. For example, the first electrode 381 may contain one of indium tin oxide (ITO), indium zinc oxide (IZO), indium gallium zinc oxide (IGZO), or combinations thereof, but embodiments of the present disclosure are not limited thereto.

The bank 384 may be disposed on the first electrode 381 and the planarization layer 360. The bank 384 may be disposed to expose a portion of the top surface of the first electrode 381.

The bank 384 may be a component defining the emission area EA and the non-emission area NEA in the active area AA. Specifically, a portion of the active area AA in which the bank 384 is disposed may be the non-emission area NEA, and the remaining portion of the active area AA may be the emission area EA.

The organic layer 382 including at least one emissive layer may be disposed on the top surface of the first electrode 381 on which the bank 384 is not disposed. Although the structure in which the organic layer 382 is disposed on the top surface of the first electrode 381 exposed by the bank 384 is illustrated in FIG. 3, the structure according to embodiments of the present disclosure is not limited thereto. For example, the organic layer 382 may be disposed on the entire surface of the active area AA.

The second electrode 383 may be disposed on the organic layer 382. The second electrode 383 may include a reflective material. For example, the second electrode 383 may contain one selected from among Al, Au, Cu, W, Ti, Mo, or combinations thereof, but embodiments of the present disclosure are not limited thereto.

Although the second electrode 383 may be disposed on the entire surface of the substrate 210 in the active area AA, embodiments of the present disclosure are not limited thereto.

Due to the first electrode 381 of the organic light-emitting diode 380 contains a transparent conductive material and the second electrode 383 contains a reflective material as described above, the organic light-emitting diode 380 having a bottom emission structure may be realized.

However, embodiments of the present disclosure are not limited thereto, and any configuration may be used as long as at least one of the first electrode 381, the second electrode 383, or a combination thereof, contains a transparent conductive material.

For example, the first electrode 381 may contain a reflective metal and the second electrode 383 may contain a transparent conductive material to realize the organic light-emitting diode 380 having a top emission structure. Alternatively, each of the first electrode 381 and the second electrode 383 may contain transparent conductive material to realize the organic light-emitting diode 380 having a double-sided emission structure.

An encapsulation member 390 may be disposed on the second electrode 383 of the organic light-emitting diode 380.

The encapsulation member 390 may include a first encapsulation layer 391 disposed on the second electrode 383, a second encapsulation layer 292 disposed on the first encapsulation layer 391, and a third encapsulation layer 293 disposed on the second encapsulation layer 292.

Here, the first encapsulation layer 391 and the third encapsulation layer 293 may contain an inorganic insulating material, while the second encapsulation layer 292 may contain an organic insulating material. Here, the thickness of the second encapsulation layer 292 may be sufficient to prevent particles from penetrating into the organic light-emitting diode 380 through the first encapsulation layer 391.

As illustrated in FIGS. 2 and 3, the encapsulation member 390 according to embodiments may be disposed on the entirety of the active area AA. As illustrated in FIG. 2, the encapsulation member 390 may also be disposed on a portion of the non-active area NA.

The structure of the encapsulation member 390 extending through a portion of the non-active area NA will be discussed as follows with reference to FIGS. 4 and 5.

Figure 4:
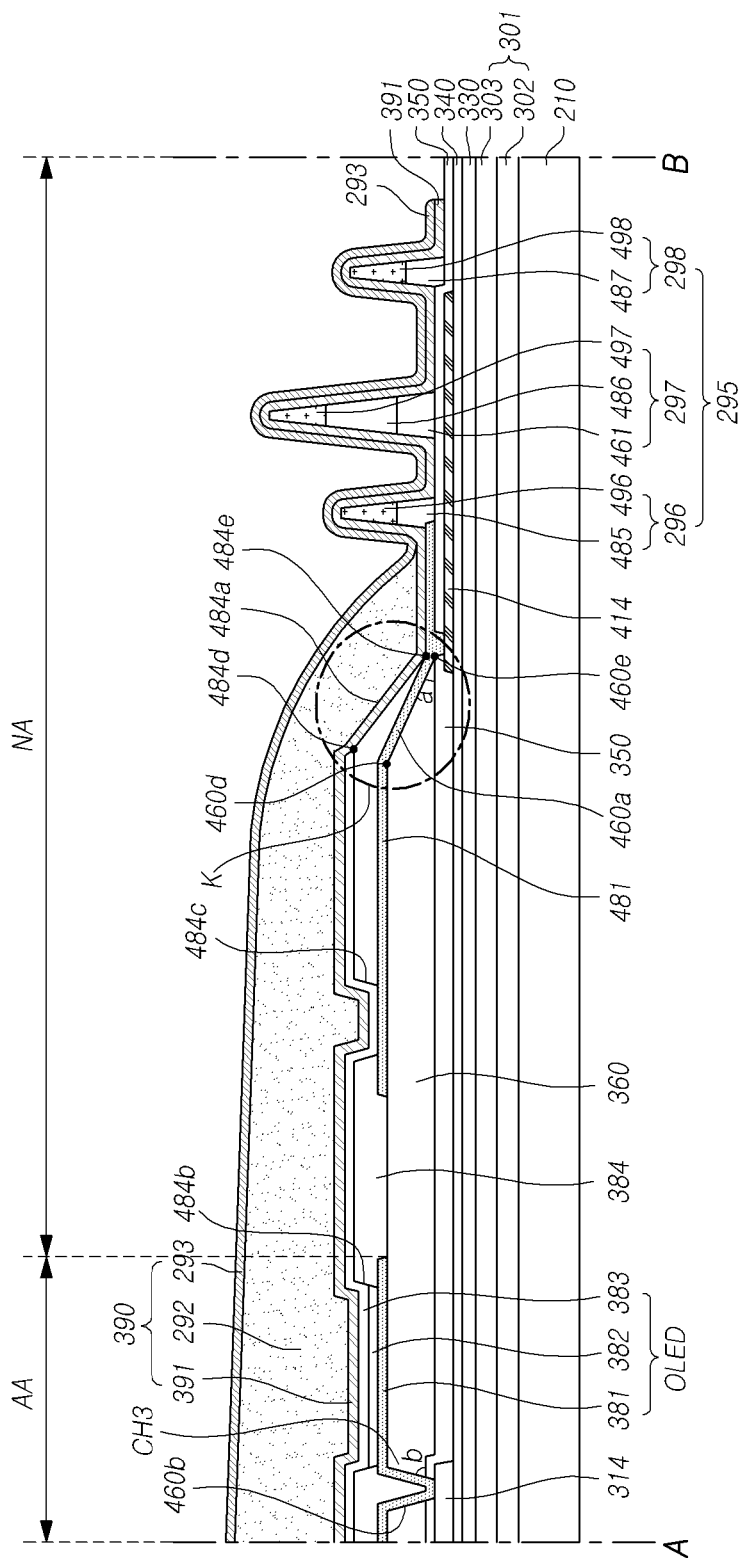
FIG. 4 is a cross-sectional view taken along line A-B in FIG. 2.
Figure 5:
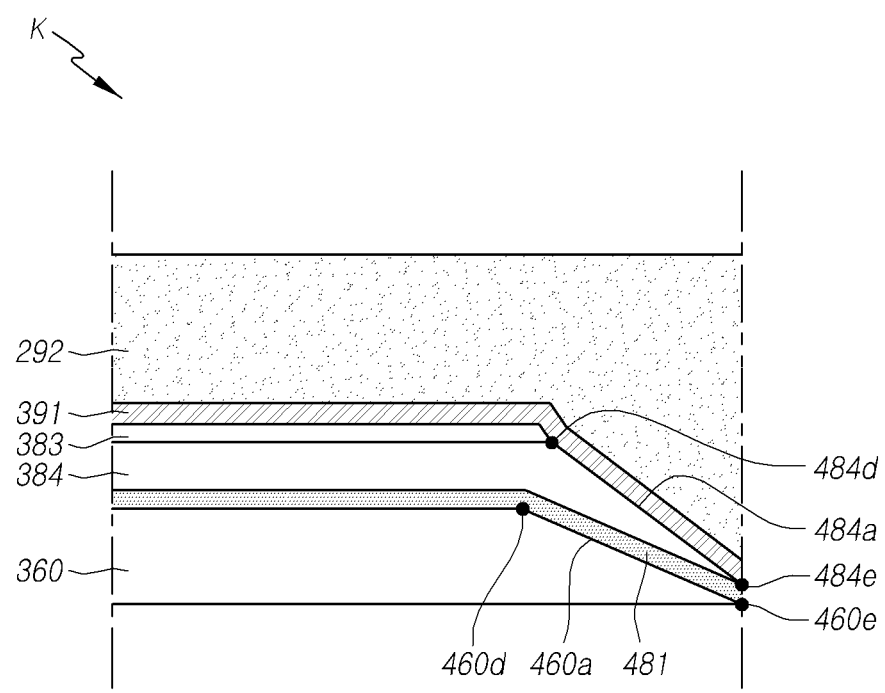
FIG. 5 is an enlargement of portion K in FIG. 4.

FIG. 4 is a cross-sectional view taken along line A-B in FIG. 2, and FIG. 5 is an enlargement of portion K in FIG. 4.

Hereinafter, the cross-sectional structure of a portion of the active area AA and a portion of the non-active area NA of the display device according to embodiments will be described with reference to FIGS. 4 and 5.

First, referring to FIG. 4, the buffer layer 301 may be disposed on the substrate 210.

The gate insulating film 330 may be disposed on the buffer layer 301.

The buffer layer 301 and the gate insulating film 330 may be disposed in the active area AA and the non-active area NA.

In the active area AA, the drain electrode 314 of the transistor may be disposed on the gate insulating film 330.

In the non-active area NA, a pad electrode 414 may be disposed on the gate insulating film 330. Although the pad electrode 414 may contain the same material as the drain electrode 314 of the transistor located in the active area AA, embodiments of the present disclosure are not limited thereto.

The interlayer insulating film 340 may be disposed on the drain electrode 314 of the transistor and the pad electrode 414.

The passivation layer 350 may be disposed on the interlayer insulating film 340.

The interlayer insulating film 340 and the passivation layer 350 may be disposed in the active area AA and the non-active area NA.

The planarization layer 360 may be disposed on the passivation layer 350.

The planarization layer 360 may be disposed in the active area AA to extend to a portion of the non-active area NA.

The planarization layer 360 may overlap a portion of the top surface of the pad electrode 414 in the non-active area NA, but embodiments of the present disclosure are not limited thereto. The planarization layer 360 may be disposed in a portion of the non-active area NA without overlapping the top surface of the pad electrode 414.

In addition, a first layer 461 of the second dam 297 disposed in the non-active area NA is spaced apart from the planarization layer 360. The first layer 461 of the second dam 297 may be disposed on the same layer, while containing the same material, as the planarization layer 360.

In the active area AA, the first electrode 381 of an organic light-emitting element or an organic light-emitting diode OLED may be disposed on the planarization layer 360.

In addition, in the non-active area NA, a connector electrode 481 may be disposed on the planarization layer 360. The connector electrode 481 may be disposed in a portion of the non-active area NA.

Although the connector electrode 481 may contain the same material as the first electrode 381 of the organic light-emitting diode OLED, embodiments of the present disclosure are not limited thereto. In the non-active area NA, the connector electrode 481 may be electrically connected to the pad electrode 414 through the contact holes provided in the passivation layer 350.

The bank 384 may be disposed on the planarization layer 360 on which the first electrode 381 of the organic light-emitting diode OLED and the connector electrode 481 are disposed.

As described above with reference to FIG. 3, the bank 384 in the active area NA may be defined as the emission area and the non-emission area.

The bank 384 may be disposed to extend to a portion of the non-active area NA. For example, as illustrated in FIG. 4, the bank 384 may be disposed to extend to a portion of the non-active area NA in which the planarization layer 360 is located. Here, as illustrated in FIG. 5, in the non-active area NA, one edge of the bank 384 may overlap one edge of the planarization layer 360.

In other embodiments, a slope of the bank 384 from a first point 484d of the bank 384 to a second point 484e of the bank 384 (a first point 484d may also be referred to as an outermost portion 484d of the top surface of the bank 384 and a second point 484e may also be referred to as an end portion 484e of the first side surface 484a of the bank 384) overlaps or at least partially overlaps with a slope of the planarization layer 360 from a first point 460d of the planarization layer 360 to a second point 460e the planarization layer 360 (a first point 460d may also be referred to as an outermost portion 460d of the top surface of the planarization layer 360 and a second point 460e may also be referred to as an end portion 460e of the first side surface 460a of the planarization layer 360).

Specifically, in the non-active area NA, the planarization layer 360 and the bank 384 may be located such that an end portion of a side surface of the planarization layer 360 disposed closest to the first dam 296 and an end portion of a side surface of the bank 384 disposed closest to the first dam 296 may correspond to each other.

Referring to FIG. 4, a first layer 485 of the first dam 296, a second layer 486 of the second dam 297, a first layer 487 of the third dam 298, located in the non-active area NA, may be spaced apart from the bank 384 while being disposed on the same layer and made of the same material as the bank 384.

Although the first layer 485 of the first dam 296 may overlap one edge of the connector electrode 481, the structure according to embodiments of the present disclosure is not limited thereto. For example, embodiments of the present disclosure may include a structure in which one surface of the first layer 485 of the first dam 296 is in contact with one surface of the connector electrode 481 in the non-active area NA or a structure in which the first layer 485 of the first dam 296 and the connector electrode 481 are spaced apart from each other in the non-active area NA.

In addition, in the non-active area NA, the second layer 496 of the first dam 296 may be disposed on the first layer 485 of the first dam 296, the third layer 497 of the second dam 297 may be disposed on the second layer 486 of the second dam 297, and the second layer 498 of the third dam 298 may be disposed on the first layer 487 of the third dam 298.

Although the second layer 496 of the first dam 296, the third layer 497 of the second dam 297, and the second layer 498 of the third dam 298 may contain the same material, embodiments of the present disclosure are not limited thereto.

Although not shown in FIG. 4, at least one spacer may be disposed on a portion of the top surface of the bank 384 in the non-emission area of the active area AA. The spacer may be a component able to support a mask in the operation of fabricating the organic layer of the organic light-emitting diode OLED.

Although the second layer 496 of the first dam 296, the third layer 497 of the second dam 297, and the second layer 498 of the third dam 298 may contain the same material as the spacer located in the active area AA, embodiments of the present disclosure are not limited thereto.

The organic layer 382 of the organic light-emitting diode OLED including at least one emissive layer may be located in a portion of the active area AA in which the bank 384 is not disposed.

In addition, the second electrode 383 of the organic light-emitting diode OLED may be disposed on the organic layer 382 and the bank 384 in the active area AA.

The second electrode 383 of the organic light-emitting diode OLED may be disposed to extend to a portion of the non-active area NA. For example, the second electrode 383 may be disposed to extend to a portion of the top surface of the bank 384 located in the non-active area NA.

In the non-active area NA, the second electrode 383 of the organic light-emitting diode OLED may be in contact with the connector electrode 481 disposed on the planarization layer 360 through the contact hole of the bank 384.

The first encapsulation layer 391 of the encapsulation member 390 is disposed on the second electrode 383 of the organic light-emitting diode OLED.

The first encapsulation layer 391 may be provided in the entirety of the active area AA and may extend to the non-active area NA.

Specifically, in the non-active area NA, the first encapsulation layer 391 may be disposed to cover the second electrode 383 of the organic light-emitting diode OLED, the bank 384, the connector electrode 481, the first dam 296, the second dam 297, and the third dam 298.

The second encapsulation layer 292 may be disposed on the first encapsulation layer 391.

The second encapsulation layer 292 may be provided in the entirety of the active area AA and may extend to the non-active area NA.

Specifically, the second encapsulation layer 292 may be disposed to cover the second electrode 383, the bank 384, and the planarization layer 360 in the non-active area NA. In addition, in a structure in which a portion of the top surface of the connector electrode 481 overlaps the first dam 296, the second encapsulation layer 292 may overlap a portion of the top surface of the connector electrode 481.

The second encapsulation layer 292 may contain an organic insulation material.

The second encapsulation layer 292 may be formed to be flat in the active area AA. In addition, the second encapsulation layer 292 may be configured such that a portion thereof disposed in a portion of the non-active area NA may be thinner than a portion thereof located in the active area AA.

The thickness of a specific portion of the second encapsulation layer 292, disposed in a portion of the non-active area NA, may gradually decrease, such that at least one surface of the second encapsulation layer 292 may have a slope. The surface of the second encapsulation layer 292 having a slope may refract light, thereby degrading image quality. Accordingly, the surface of the second encapsulation layer 292 having a slope may be located in the non-active area NA.

The second encapsulation layer 292 may cover foreign matter or particles that may occur during processing. For example, defects, such as fine cracks, produced by foreign matter or particles, may be present in the first encapsulation layer 391. The second encapsulation layer 292 may cover and protect a cracked area of the first encapsulation layer 391, e.g., an area of the first encapsulation layer 391 in which fine cracks are present.

However, the second encapsulation layer 292 may be outside of actually designed value, due to high flowability of a second encapsulation layer material.

On the other hand, for example, in a case in which the second encapsulation layer material is applied to the substrate 210 in a smaller amount in consideration of the flowability of a second encapsulation layer material, the second encapsulation layer 292 may be formed to only extend to a portion of the top surface of the bank 384 in the non-active area NA.

In addition, the bank 384 containing an organic insulating material may be configured such that the bank 384 has a protruding portion (e.g., a protruding portion on one edge of the bank 384) in the non-active area NA. In this case, the second encapsulation layer material may be blocked and prevented from flowing further by the protruding portion of the bank 384, such that the second encapsulation layer 292 may not extend beyond the top surface of the bank 384.

In this case, only the first encapsulation layer 391 and the third encapsulation layer 293 containing an inorganic insulating material may be disposed on the side surfaces of the bank 384 and the planarization layer 360 located in the non-active area NA.

In addition, in a case in which defects caused by foreign matter or particles are present on the first encapsulation layer 391 in the side surfaces of the bank 384 and the planarization layer 360 located in the non-active area NA, the thin third encapsulation layer 293 may be disposed on the cracked area of the first encapsulation layer 391. That is, the third encapsulation layer 293 is too thin to properly cover a cracked area of the first encapsulation layer 391. Thus, moisture, oxygen, or the like may penetrate into a portion of the third encapsulation layer 293 disposed in an area corresponding to the cracked area of the first encapsulation layer 391. The moisture or oxygen that has penetrated into the third encapsulation layer 293 may diffuse through the planarization layer 360 to finally reach the organic layer 382 of the organic light-emitting diode OLED, thereby degrading the reliability of the organic light-emitting diode OLED.

In other words, since the second encapsulation layer 292 is not disposed on the side surface of the bank 384 or the planarization layer 360 located in the non-active area NA, moisture or oxygen may penetrate through the first and third encapsulation layers 391 and 293.

Embodiments of the present disclosure have a structure able to prevent a phenomenon, in which the second encapsulation layer 292 may not be disposed on the side surface of the bank 384 or the planarization layer 360 located in the non-active area NA, in the process of fabricating the second encapsulation layer 292.

Specifically, an inclination of a first side surface 460a of the planarization layer 360 with respect to the top surface of the substrate 210 in the non-active area NA is smaller than an inclination of a second side surface 460b of the planarization layer 360 surrounding the third contact hole CH3 of the planarization layer 360 located in the active area AA.

Here, the first side surface 460a of the planarization layer 360 may be a side surface located in the non-active area NA and disposed closest to the first dam 296, among the side surfaces of the planarization layer 360.

As described above, the inclination of the first side surface 460a of the planarization layer 360 with respect to the top surface of the substrate 210 is smaller than the inclination of the second side surface 460b of the planarization layer 360 surrounding the third contact hole CH3 of the planarization layer 360 located in the active area AA, such that the inclination of a first side surface 484a of the bank 384 disposed on the first side surface 460a of the planarization layer 360 (e.g., the inclination with respect to the top surface of the substrate 210) may also be gentle. Here, the first side surface 484a of the bank 384 may be a side surface located in the non-active area NA and disposed closest to the first dam 296, among side surfaces of the bank 384.

In some embodiments, the inclination of a first side surface 484a of the bank 384 may be gentle in the sense that the inclination of the first side surface 484a of the bank 384 with respect to the top surface of the substrate 210 is smaller than the inclination of a second side surface 484b of the bank 384 surrounding an open area of the bank 384 (e.g., an area in which the organic layer of the OLED is disposed) in the active area AA.

In addition, the inclination of the first side surface 484a of the bank 384 with respect to the top surface of the substrate 210 may be smaller than the inclination of a third side surface 484c of the bank 384 surrounding the open area of the bank 384 through which the connector electrode 481 and the second electrode 383 are in contact with each other in the non-active area NA.

In addition, the inclination of the first side surface 484a of the bank 384 with respect to the top surface of the substrate 210 in the non-active area NA may be equal to or greater than the inclination of the first side surface 460a of the planarization layer 360 with respect to the top surface of the substrate 210.

Specifically, as illustrated in FIG. 4, in a case in which an outermost portion 460d of the top surface of the planarization layer 360 in the non-active area NA (e.g., an edge of the top surface of the planarization layer closest to the first dam) is further spaced apart from the first dam 296 than an outermost portion 484d of the top surface of the bank 384 (e.g., an edge of the top surface of the bank 384 closest to the first dam), and an end portion 460e of the first side surface 460a of the planarization layer 360 (e.g., a portion of the planarization layer 360, the thickness of which decreases to a minimum thickness (about 0) in the non-active area NA) and an end portion 484e of the first side surface 484a of the bank 384 (e.g., a portion of the bank 384, the thickness of which decreases to a minimum thickness (about 0) in the non-active area NA) are equally spaced apart from the first dam 296, the inclination of the first side surface 484a of the bank 384 may be greater than the inclination of the first side surface 460a of the planarization layer 360. However, the present disclosure is not limited thereto, and the distance between the first dam 296 and the outermost portion 460d of the top surface of the planarization layer 360 may be smaller than or equal to the distance between the first dam 296 and the outermost portion 484d of the top surface of the bank 384.

Here, the distance between the first dam 296 and the outermost portion 460d of the top surface of the planarization layer 360 and the distance between the first dam 296 and the outermost portion 484d of the top surface of the bank 384 may indicate minimum distances to the first dam 296 from points at which virtual vertical lines vertically extending in a direction from the outermost portion 460d of the top surface of the planarization layer 360 and the outermost portion 484d of the top surface of the bank 384 to the top surface of the substrate 210 intersect the top surface of the passivation layer 350.

In addition, although not shown in the drawings, in a case in which the outermost portion 460d of the top surface of the planarization layer 360 and the outermost portion 484d of the top surface of the bank 384 in the non-active area NA are disposed to be equally spaced apart from the first dam 296 and the end portion 460e of the first side surface 460a of the planarization layer 360 and the end portion 484e of the first side surface 484a of the bank 384 are disposed to be equally spaced apart from the first dam 296, the inclination of the first side surface 484a of the bank 384 may be the same as the inclination of the first side surface 460a of the planarization layer 360.

Even in the case in which, in the non-active area NA, the inclination of the first side surface 484a of the bank 384 with respect to the top surface of the substrate 210 is greater than the inclination of the first side surface 460a of the planarization layer 360 with respect to the top surface of the substrate 210, the inclination of the first side surface 484a may be smaller than the inclination of the second side surface 484b or the third side surface 484c.

Referring to FIGS. 4 and 5, in the non-active area NA, the connector electrode 481 may be provided on the first side surface 460a of the planarization layer 360 such that the inclination thereof is the same as the inclination of the first side surface 460a of the planarization layer 360. The first encapsulation layer 391 may be provided on the first side surface 484a of the bank 384 such that the inclination thereof is the same as the inclination of the first side surface 484a of the bank 384.

That is, due to the gentle inclination of the first side surface 460a of the planarization layer 360 in the non-active area NA, each of the connector electrode 481, the bank 384, and the first encapsulation layer 391 disposed on the first side surface 460a of the planarization layer 360 may also have a gentle inclination, in an area corresponding to the area in which the first side surface 460a of the planarization layer 360 is disposed. In particular, the inclination of the first encapsulation layer 391 may correspond to the inclination of the first side surface 484a of the bank 384 disposed below the first encapsulation layer 391.

Accordingly, in a portion of the non-active area NA corresponding to the area in which the first side surface 460a of the planarization layer 360 is disposed, the second encapsulation layer material having high flowability may flow along the top surface of the first encapsulation layer 391 to reach a position adjacent to the first dam 296, so that the second encapsulation layer 292 may be finally provided to cover the first side surface 460a of the planarization layer 360 and the first side surface 484a of the bank 384.

The second encapsulation layer material may flow to the first dam 296, and the first dam 296 may serve to prevent the second encapsulation layer material from being excessively applied.

Accordingly, in a case in which the first encapsulation layer 391 has a defect due to foreign matter or particles on the side surface of the bank 384 or the planarization layer 360 located in the non-active area NA, the second encapsulation layer 292 disposed to cover the first encapsulation layer 391 may improve the encapsulation effect of the encapsulation member 390.

That is, an angle a between the first side surface 460a of the planarization layer 360 and the top surface of the substrate 210 in the non-active area NA may be smaller than an angle b between the second side surface 460b of the planarization layer 360, surrounding the third contact hole CH3 of the planarization layer 360, and the top surface of the substrate 210 in the active area AA.

For example, the angle a between the first side surface 460a of the planarization layer 360 and the top surface of the substrate 210 in the non-active area NA may range from 15° to 30°, while the angle b between the second side surface 460b of the planarization layer 360, surrounding the third contact hole CH3 of the planarization layer 360, and the top surface of the substrate 210 in the active area AA may range be 50° or more.

Here, when the angle a between the first side surface 460a of the planarization layer 360 and the top surface of the substrate 210 in the non-active area NA is less than 15°, the thickness of the planarization layer 360 may be excessively low, such that the capability of the planarization layer 360 for planarization of the substrate 210 may be reduced. In addition, when the angle a between the first side surface 460a of the planarization layer 360 and the top surface of the substrate 210 in the non-active area NA exceeds 30°, the covering capability (e.g., retention capability) of the second encapsulation layer material may be reduced, and thus, the second encapsulation layer 292 may be disposed to expose the first side surface 460a of the planarization layer 360 and the first side surface 484a of the bank 384 in the non-active area NA, thereby reducing the encapsulation effect of the encapsulation member 390.

The third encapsulation layer 293 may be disposed on the second encapsulation layer 292.

In the non-active area NA, one edge of the third encapsulation layer 293 may overlap one edge of the first encapsulation layer 391. That is, the third encapsulation layer 293 may be disposed on the entire surface of the active area AA and may be disposed to cover the top surface and the side surface of the second encapsulation layer 292 in the non-active area NA. In addition, the third encapsulation layer 293 may be disposed to cover the first to third dams 296, 297, and 298 in the non-active area NA.

Although the structure in which one edge of the bank 384 and one edge of the planarization layer 360 overlap each in the non-active area NA has been described with reference to FIGS. 4 and 5, the structure according to embodiments is not limited thereto.

Another arrangement structure of the bank 384 and the planarization layer 360 in the non-active area NA will be discussed as follows.

Figure 6:
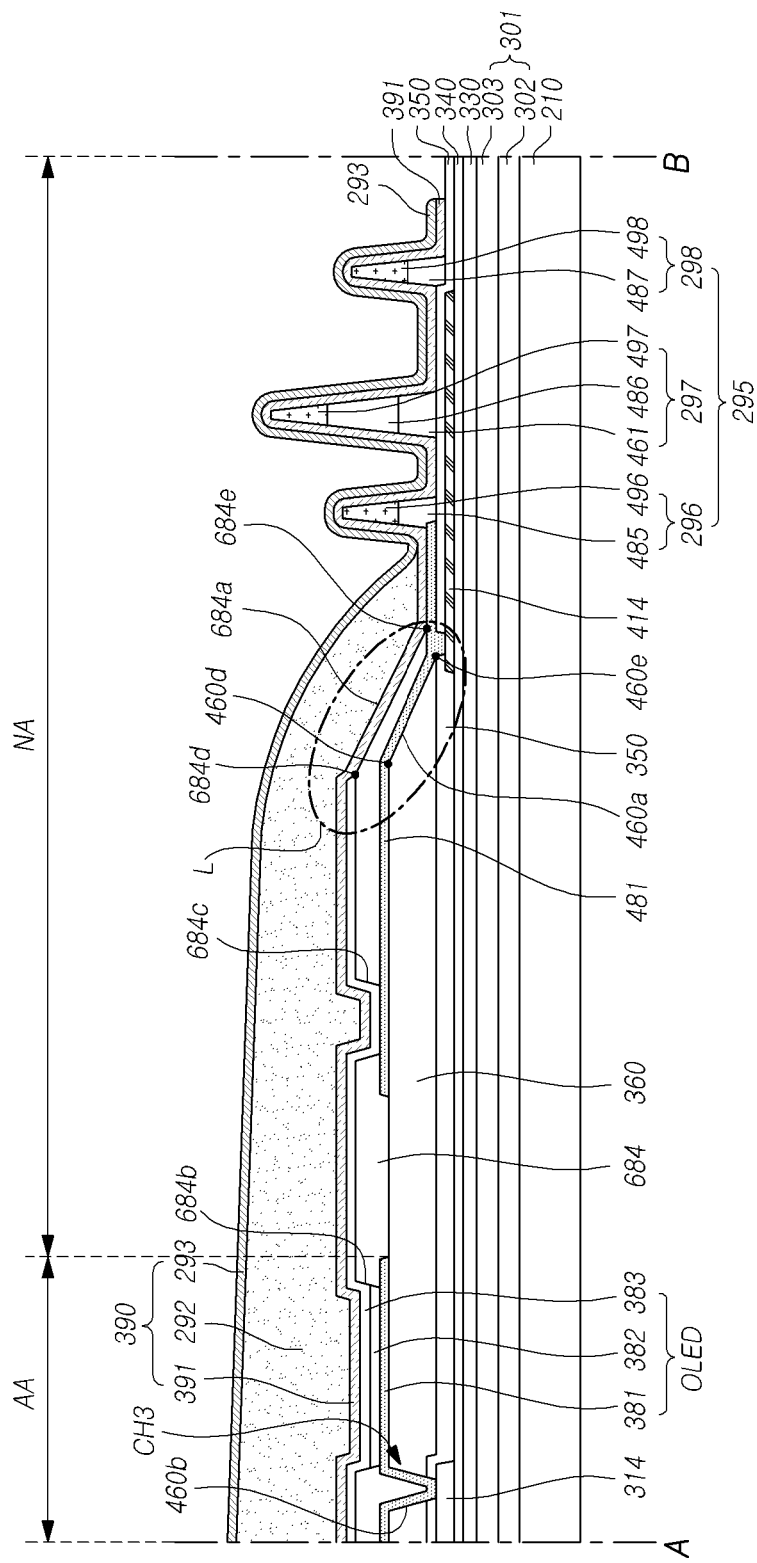
FIG. 6 is a cross-sectional view illustrating a portion of an active area and a portion of a non-active area of a display device according to another embodiment.
Figure 7:
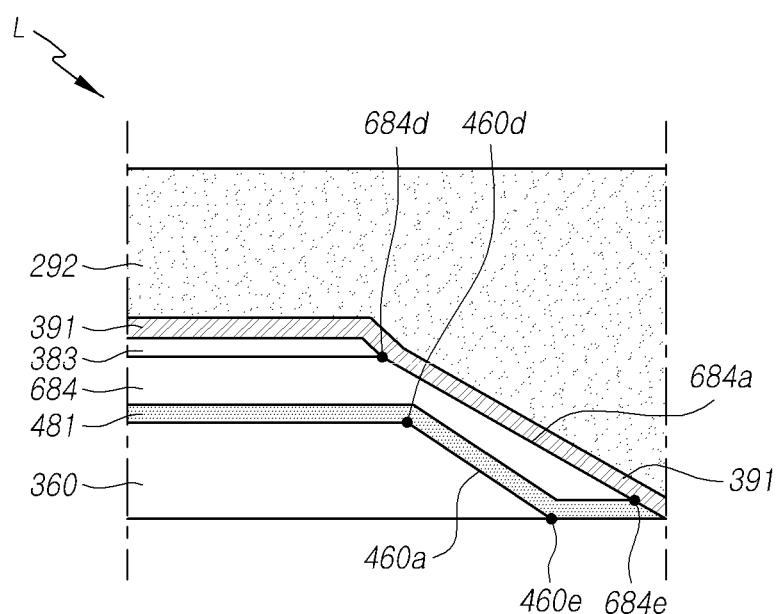
FIG. 7 is an enlargement of portion L in FIG. 6.

FIG. 6 is a cross-sectional view illustrating a portion of an active area and a portion of a non-active area of a display device according to another embodiment, and FIG. 7 is an enlargement of portion L in FIG. 6.

The structure illustrated in FIGS. 6 and 7 may be a structure obtained by modifying portion K in FIG. 4. The structure illustrated in FIG. 6 may be the same as that illustrated in FIG. 4, except for portion K in FIG. 4. The structure of the planarization layer 360 illustrated in FIGS. 6 and 7 may be substantially the same as the structure of the planarization layer 360 described above with reference to FIG. 4.

Referring to FIGS. 6 and 7, a bank 684 may be disposed in the non-active area NA to cover the side surface and the top surface of the planarization layer 360. Here, the bank 684 may be disposed to cover the first side surface 460a of the planarization layer 360. That is, in the non-active area NA, an end portion 684e of the first side surface 684a of the bank 684 may be disposed closer to the first dam 296 than an end portion 460e of the first side surface 460a of the planarization layer 360.

In addition, the inclination of the first side surface 460a of the planarization layer 360 with respect to the top surface of the substrate 210 in the non-active area NA is smaller than the inclination of the second side surface 460b of the planarization layer 360 surrounding the third contact hole CH3 of the planarization layer 360 in the active area AA.

As described above, the inclination of the first side surface 460a of the planarization layer 360 with respect to the top surface of the substrate 210 in the non-active area NA is smaller than the inclination of the second side surface 460b of the planarization layer 360 surrounding the third contact hole CH3 of the planarization layer 360 in the active area AA. Thus, the inclination of a first side surface 684a of the bank 684 (e.g., the inclination with respect to the top surface of the substrate) may also be gentle, due to the area overlapping the first side surface 460a of the planarization layer 360.

Accordingly, the inclination of the first side surface 684a of the bank 684 with respect to the top surface of the substrate 210 may be smaller than the inclination of a second side surface 684b of the bank 684 surrounding an open area of the bank 684 (e.g., an area in which the organic layer of the OLED is disposed) in the active area AA.

In addition, the inclination of the first side surface 684a of the bank 684 with respect to the top surface of the substrate 210 may be smaller than a third side surface 684c of the bank 684 surrounding the open area of the bank 684 through which the connector electrode 481 and the second electrode 383 are in contact with each other in the non-active area NA.

In the non-active area NA, the inclination of the first side surface 684a of the bank 684 with respect to the top surface of the substrate 210 may be smaller than the inclination of the first side surface 460a of the planarization layer 360 with respect to the top surface of the substrate 210.

Specifically, in the structure in which the bank 684 covers the planarization layer 360 in the non-active area NA, the outermost portion 460d of the top surface of the planarization layer 360 is disposed closer to the first dam 296 than the outermost portion 684d of the top surface of the bank 684, and an end portion 460e of the first side surface 460a of the planarization layer 360 is further spaced apart from the first dam 296 than an end portion 684e of the first side surface 684a of the bank 684. Thus, the inclination of the first side surface 684a of the bank 684 may be smaller than the inclination of the first side surface 460a of the planarization layer 360.

Here, the distance between the first dam 296 and the outermost portion 460d of the top surface of the planarization layer 360 and the distance between the first dam 296 and the outermost portion 684d of the top surface of the bank 684 may indicate minimum distances to the first dam 296 from points at which virtual vertical lines vertically extending in a direction from the outermost portion 460d of the top surface of the planarization layer 360 and the outermost portion 684d of the top surface of the bank 684 to the top surface of the substrate 210 intersect the top surface of the passivation layer 350.

In addition, the distance from the outermost portion 460d of the top surface of the planarization layer 360 to the end portion 460e of the first side surface 460a of the planarization layer 360 (e.g., the length of the first side surface 460a of the planarization layer 360 in the cross section) may be shorter than the distance from the outermost portion 684d of the top surface of the bank 684 to the end portion 684e of the first side surface 684a of the bank 684 (e.g., the length of the first side surface 684a of the bank 684 in the cross section).

In this case, the inclination of the first side surface 684a of the bank 684 may be smaller than the inclination of each of the first side surface 460a of the planarization layer 360, the second side surface 684b of the bank 684, and the third side surface 684c of the bank 684.

That is, due to the first side surface 460a of the planarization layer 360 and the first side surface 684a of the bank 684 respectively having a gentle inclination in the non-active area NA, the first encapsulation layer 391 may also have a gentle inclination in an area corresponding to the area in which the first side surface 460a of the planarization layer 360 and the first side surface 684a of the bank 684 are disposed.

In particular, the shape of the first encapsulation layer 391 may be determined by the shape of the bank 684 disposed below the first encapsulation layer 391. Thus, in the area in which the first side surface 684a of the bank 684 is disposed, the inclination of the first encapsulation layer 391 may correspond to that of the first side surface 684a of the bank 684.

Accordingly, in a portion of the non-active area corresponding to the area in which the first side surface 460a of the planarization layer 360 and the first side surface 684a of the bank 684 are disposed, the second encapsulation layer material having high flowability may flow along the top surface of the first encapsulation layer 391 to reach a position adjacent to the first dam 296, so that the second encapsulation layer 292 may be finally formed to cover the first side surface 460a of the planarization layer 360 and the first side surface 684a of the bank 684 in the non-active area NA.

Figure 8:
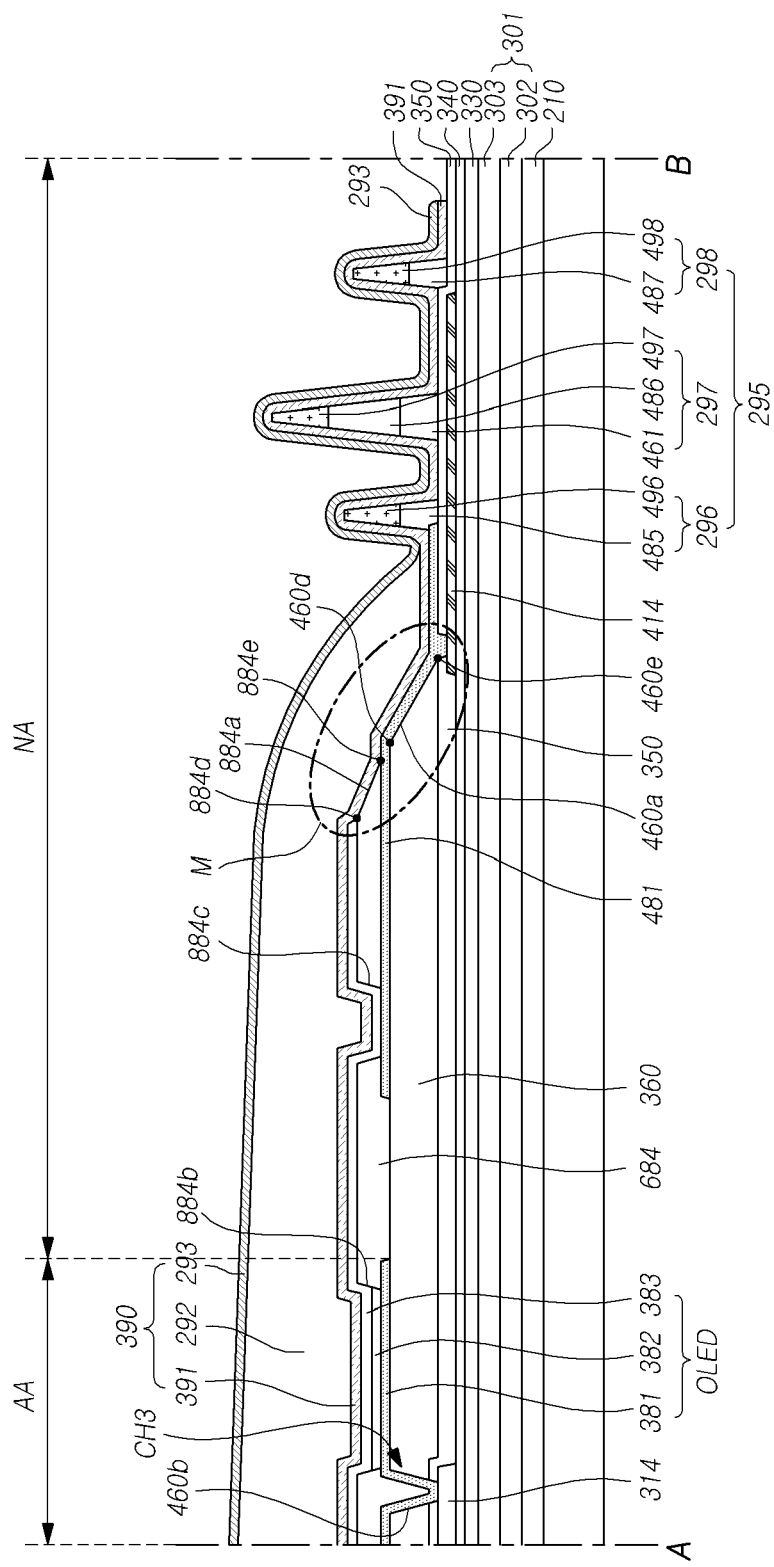
FIG. 8 is a cross-sectional view illustrating a portion of an active area and a portion of a non-active area of a display device according to another embodiment.
Figure 9:
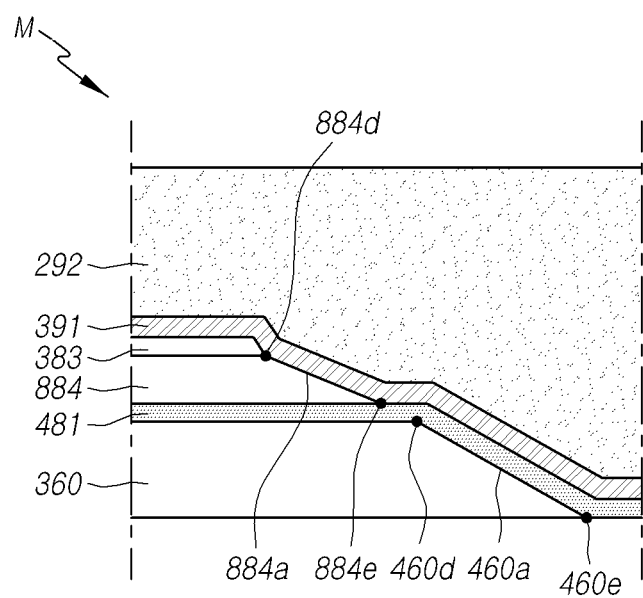
FIG. 9 is an enlargement of portion M in FIG. 8.

FIG. 8 is a cross-sectional view illustrating a portion of an active area and a portion of a non-active area of a display device according to another embodiment, and FIG. 9 is an enlargement of portion M in FIG. 8.

The structure illustrated in FIGS. 8 and 9 may be a structure obtained by modifying portion K in FIG. 4. The structure illustrated in FIG. 8 may be the same as that illustrated in FIG. 4, except for portion K in FIG. 4. The structure of the planarization layer 360 illustrated in FIGS. 8 and 9 may be substantially the same as the structure of the planarization layer 360 described above with reference to FIG. 4.

Referring to FIGS. 8 and 9, in the non-active area NA, a bank 884 may be disposed to overlap the top surface of the planarization layer 360 while exposing the first side surface 460a of the planarization layer 360. That is, a first side surface 884a of the bank 884 may be disposed on the top surface of the planarization layer 360.

The inclination of the first side surface 884a of the bank 884 with respect to the top surface of the substrate 210 may be smaller than the inclination of a second side surface 884b of the bank 884 surrounding an open area of the bank 884

(e.g., an area in which an organic layer of the organic light-emitting diode is disposed) in the active area AA.

In addition, the inclination of the first side surface 884a of the bank 884 with respect to the top surface of the substrate 210 may be smaller than the inclination of a third side surface 884c of the bank 884 surrounding the open area of the bank 884 through which the connector electrode 481 and the second electrode 383 are in contact with each other, located in the non-active area NA.

In addition, in the non-active area NA, the outermost portion 460d of the top surface of the planarization layer 360 may be located closer to the first dam 296 than the outermost portion 884d of the top surface of the bank 684. The outermost portion 460d of the top surface of the planarization layer 360 may also be located closer to the first dam 296 than an end portion 884e of the first side surface 884a of the bank 884.

The distance from the outermost portion 460d of the top surface of the planarization layer 360 to an end portion 460e of the first side surface 460a of the planarization layer 360 may be longer than the distance from the outermost portion 884d of the top surface of the bank 684 to an end portion 884e of the first side surface 884a of the bank 684.

Here, in the non-active area NA, the inclination of the first side surface 884a of the bank 884 may be smaller than the inclination of the first side surface 460a of the planarization layer 360.

Accordingly, the first encapsulation layer 391 disposed on the bank 884 and the planarization layer 360 may have an inclination corresponding to the inclination of the first side surface 460a of the planarization layer 360 in the area in which the first side surface 460a of the planarization layer 360 is located and may have an inclination corresponding to the inclination of the first side surface 884a of the bank 884 in the area in which the first side surface 884a of the bank 884 is located.

That is, according to the present embodiment, the inclination of the first encapsulation layer 391 may change in the area corresponding to the boundary between the first side surface 460a of the planarization layer 360 and the first side surface 884a of the bank 884.

Accordingly, in the process of fabricating the second encapsulation layer 292, the speed of flow of the second encapsulation layer material may change in the area corresponding to the boundary between the first side surface 460a of the planarization layer 360 and the first side surface 884a of the bank 884.

For example, since the inclination of the first side surface 884a of the bank 884 is smaller than the inclination of the first side surface 460a of the planarization layer 360, the second encapsulation layer material may flow at a low speed in the area corresponding to first side surface 884a of the bank 884, and the speed of flow of the second encapsulation layer material may increase in the area corresponding to the boundary between the first side surface 460a of the planarization layer 360 and the first side surface 884a of the bank 884.

Here, the second encapsulation layer 292 may be provided to extend to an area in which the first dam 296 is disposed.

As described above, due to the adjustment of the positions of the bank 884 and the planarization layer 360 and the inclinations of each component in the non-active area NA, the second encapsulation layer 292 may be disposed to cover the first side surface 460a of the planarization layer 360 and the first side surface 884a of the bank 884 in the non-active area NA.

According to embodiments of the present disclosure, the first inclination of the first side surface of the planarization layer, located in the non-active area and closest to the dam, with respect to the top surface of the substrate is smaller than the second inclination of the second side surface of the planarization layer surrounding the contact hole with respect to the top surface of the substrate. Accordingly, the second encapsulation layer may be disposed to cover the surfaces of the planarization layer and the bank in the non-active area, thereby improving the encapsulation ability of the encapsulation member.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light-emitting panel having an active area and a non-active area located at a periphery of the active area, the organic light-emitting panel comprising:
   a substrate;
   a planarization layer disposed on the substrate, the planarization layer including a first side surface having a first inclination angle and a second side surface having a second inclination angle that is different from the first inclination angle, each of the first and second side surfaces extending from a top surface of the planarization layer to a bottom region of the planarization layer;
   a contact hole in the planarization layer and located in the active area, the contact hole being adjacent to the second side surface of the planarization layer, the second side surface of the planarization layer being a side surface of the contact hole;
   a first electrode disposed on the planarization layer;
   a bank disposed on a portion of a top surface of the planarization layer and a portion of a top surface of the first electrode;

an organic layer disposed on the top surface of the first electrode disposed in a first open area of the bank in the active area;

a second electrode disposed on the organic layer and the bank;

a dam located in the non-active area to at least partially surround the active area;

an encapsulation member disposed on the second electrode and the substrate on which the dam is disposed; and a connector electrode disposed on the planarization layer in the non-active area, and electrically connected to the second electrode, wherein, from among side surfaces of the planarization layer, the first inclination angle of the first side surface of the planarization layer is located in the non-active area and closest to the dam and the second side surface is located in the active area, wherein the first inclination angle of the first side surface with respect to a top surface of the substrate is smaller than the second inclination angle of the second side surface of the planarization layer, with respect to the top surface of the substrate, and wherein the first side surface of the planarization layer extends from an outermost portion of a top surface of the planarization layer to an end portion of the planarization layer in the non-active area.

2. The organic light-emitting panel according to claim 1, wherein, in the non-active area, a first side surface of the bank located in the non-active area and closest to the dam overlaps the first side surface of the planarization layer, and one edge of the bank overlaps one edge of the planarization layer.

3. The organic light-emitting panel according to claim 2, wherein, in the non-active area, a third inclination angle of the first side surface of the bank with respect to the top surface of the substrate is equal to or greater than the first inclination angle of the planarization layer.

4. The organic light-emitting panel according to claim 3, wherein, in the non-active area, an outermost portion of the top surface of the planarization layer and an outermost portion of the top surface of the bank are disposed to be equally spaced apart from the dam, and an end portion of the first side surface of the planarization layer and an end portion of the first side surface of the bank are disposed to be equally spaced apart from the dam.

5. The organic light-emitting panel according to claim 3, wherein, in the non-active area, an outermost portion of the top surface of the planarization layer is further spaced apart from the dam than an outermost portion of the top surface of the bank, and an end portion of the first side surface of the planarization layer and an end portion of the first side surface of the bank are equally spaced apart from the dam.

6. The organic light-emitting panel according to claim 3, wherein a first encapsulation layer of the encapsulation member is disposed on the first side surface of the bank, and in an area corresponding to an area in which the first side surface of the bank is disposed, the first encapsulation layer has an inclination angle corresponding to the third inclination angle.

7. The organic light-emitting panel according to claim 3, wherein the third inclination angle is smaller than a fourth inclination angle of a second side surface of the bank, surrounding the first open area of the bank, with respect to the top surface of the substrate.

8. The organic light-emitting panel according to claim 1, wherein, in the non-active area, the bank is disposed to at least partially cover the first side surface of the planarization layer.

9. The organic light-emitting panel according to claim 8, wherein, in the non-active area, a third inclination angle of the first side surface of the bank with respect to the top surface of the substrate is smaller than the first inclination angle of the planarization layer.

10. The organic light-emitting panel according to claim 9, wherein, in the non-active area, an outermost portion of the top surface of the planarization layer is disposed closer to the dam than an outermost portion of the top surface of the bank, and an end portion of the first side surface of the planarization layer is further spaced apart from the dam than an end portion of the first side surface of the bank.

11. The organic light-emitting panel according to claim 1, wherein, in the non-active area, the bank is disposed to overlap the top surface of the planarization layer and expose the first side surface of the planarization layer.

12. The organic light-emitting panel according to claim 11, wherein a third inclination angle of a first side surface of the bank, located in the non-active area and closest to the dam, with respect to the top surface of the substrate is smaller than the first inclination angle of the planarization layer.

13. The organic light-emitting panel according to claim 12, wherein the outermost portion of the top surface of the planarization layer is located closer to the dam than the end portion of the first side surface of the bank.

14. The organic light-emitting panel according to claim 13, wherein a first encapsulation layer of the encapsulation member is disposed on the first side surface of the bank and the first side surface of the planarization layer, and the inclination angle of the first encapsulation layer with respect to the top surface of the substrate changes at a boundary between the first side surface of the bank and the first side surface of the planarization layer.

15. The organic light-emitting panel according to claim 1, wherein an angle ranging from 15° to 30° is defined between the first side surface of the planarization layer and the top surface of the substrate.

16. The organic light-emitting panel according to claim 1, wherein, in the non-active area, a second encapsulation layer is disposed to at least partially cover the first side surface of the planarization layer and the bank.

17. The organic light-emitting panel according to claim 1, wherein one edge of a second encapsulation layer of the encapsulation member is disposed closer to the dam than the planarization layer and the bank.

18. The organic light-emitting panel according to claim 1, wherein the bank has at least one second open area exposing a connector electrode disposed on the planarization layer in the non-active area, wherein a third inclination angle of the first side surface of the bank, disposed closest to the dam, with respect to the top surface of the substrate is smaller than a fifth inclination angle of a third side surface of the bank, surrounding the second open area, with respect to the top surface of the substrate, and wherein the first side surface of the bank extends from an outermost portion of a top surface of the bank to an end portion of the bank in the non-active area.

19. The organic light-emitting panel according to claim 1, wherein the connector electrode is disposed on the first side surface of the planarization layer.

20. The organic light-emitting panel according to claim 1, wherein the connector electrode includes a same material as the first electrode.

21. The organic light-emitting panel according to claim 1, wherein the connector electrode is electrically connected to a pad electrode.

22. The organic light-emitting panel according to claim 21, further comprising,
a passivation film is disposed in the display area on the substrate and extends to cover the pad electrode.

23. The organic light-emitting panel according to claim 22, wherein the connector electrode is electrically connected to the pad electrode through a contact hole in the passivation layer.

24. The organic light-emitting panel according to claim 23, wherein the contact hole is provided between planarization layer and the dam in the non-display area.

25. An organic light-emitting display device comprising:
an organic light-emitting panel having a display area and a non-display area adjacent to the display area; and
a driver circuit driving the organic light-emitting panel, wherein the organic light-emitting panel includes:
  a substrate;
  a planarization layer on the substrate, the planarization layer having a first side surface located in the non-display area and a second side surface located in the non-display area and opposite the first side surface,
  a contact hole extending through the planarization layer in the display area, the second side surface of the planarization layer being a side surface of the contact hole;
  at least one of a source or drain electrode of a transistor in the display area being exposed by the contact hole, the at least one of the source or drain electrode being at a first level above the substrate;
  a first electrode on the planarization layer, the first electrode extending into the contact hole and contacting the at least one of a source or drain electrode;
  a bank on a portion of a top surface of the planarization layer and a portion of a top surface of the first electrode;
  an organic layer on the top surface of the first electrode disposed in a first open area of the bank in the display area;
  a second electrode on the organic layer and the bank;
  a dam located in the non-display area to at least partially surround the display area; and
  an encapsulation member on the second electrode and the substrate on which the dam is disposed,
  wherein a first inclination angle of the first side surface with respect to a top surface of the substrate is smaller than a second inclination angle of the second side surface of the planarization layer, with respect to the top surface of the substrate,
  wherein the first side surface of the planarization layer extends from an outermost portion of a top surface of the planarization layer to an end portion of the planarization layer in the non-active area that is at a second level above the substrate, the second level being closer to the substrate than the first level.

26. The organic light-emitting display device according to claim 25, wherein, in the non-display area, a first side surface of the bank located in the non-display area and closest to the dam overlaps the first side surface of the planarization layer.

* * * * *